United States Patent [19]
Lee et al.

[11] Patent Number: 6,097,066
[45] Date of Patent: *Aug. 1, 2000

[54] ELECTRO-STATIC DISCHARGE PROTECTION STRUCTURE FOR SEMICONDUCTOR DEVICES

[75] Inventors: Jian-Hsing Lee, Chia Yi; Yi-Hsun Wu, Taipei; Jiaw-Ren Shih, Tou Liu, all of Taiwan

[73] Assignee: Taiwan Semiconductor Manufacturing Co., Ltd., Hsinchu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 08/944,823

[22] Filed: Oct. 6, 1997

[51] Int. Cl.$^7$ .............................. H01L 23/62; H01L 29/00
[52] U.S. Cl. ........................ 257/355; 257/356; 257/357; 257/360; 257/546
[58] Field of Search .................................... 257/546, 355, 257/360, 356, 357

[56] References Cited

U.S. PATENT DOCUMENTS

| | | | |
|---|---|---|---|
| 5,637,900 | 6/1997 | Ker et al. | 257/355 |
| 5,714,784 | 2/1998 | Ker et al. | 257/360 |
| 5,831,316 | 11/1998 | Yu et al. | 257/401 |
| 5,838,050 | 11/1998 | Ker et al. | 257/377 |
| 5,852,315 | 12/1998 | Ker et al. | 257/355 |
| 5,905,287 | 5/1999 | Hirata | 257/357 |

OTHER PUBLICATIONS

Khurana et al., "ESD on CHMOS Device—Equivalent Circuits, Physical Models and Failure Mechanisms", 1985 IEEE, pp. 212–223.

Lee et al., "An Analytical Model of Positive H.B.M. ESD Current Distribution and The Modified Multi–Finger Protection Structure", 1999 IEEE, pp. 162–167.

Primary Examiner—David Hardy
Assistant Examiner—Jesse A. Fenty
Attorney, Agent, or Firm—Pillsbury Madison & Sutro LLP

[57] ABSTRACT

The structure includes a plurality of first ring shape structure formed on a semiconductor wafer to act as the gates of the MOS devices. The areas in the inner side of the first ring shape structures are drain regions. A plurality of source regions having second ring shape structures are formed around each sides the first ring shape structures. A p conductive type region is formed in the wafer adjacent to the source regions. A third ring shape structure is formed in the semiconductor wafer to surround the p+conductive type region for serving as a guard ring.

9 Claims, 4 Drawing Sheets

ELECTRO-STATIC DISCHARGE PROTECTION STRUCTURE FOR SEMICONDUCTOR DEVICES

FIELD OF THE INVENTION

The present invention relates generally to electro-static discharge (ESD) protection circuits for MOS semiconductor device, and more specifically, to a ESD protection layout for integrated circuits fabrication.

BACKGROUND OF THE INVENTION

With the advent of Ultra Large Scale Integrated (ULSI) circuits technologies, it has been a trend to scale down the geometry dimension of semiconductor devices and increase the density of semiconductor devices per unit area of silicon wafer. Electro-static discharge (ESD) protection is one of the important issues in the design of integrated circuits. ESD is also a significant problem of the fabrication of integrated circuits. For example, various transient sources such as human or machine handling of the semiconductor wafer or chip during assembly, processing. These will cause destructive electro-static pulses.

Developments in the formation of sub-micron semiconductor technologies have been quite modest in comparison. The renewed interest in high density hybrids is driven by the requirement to handle large numbers of IC interconnections, the increasing clock rate of digital systems and the desire to pack greater functionality into smaller spaces. Thus, the thickness of the gate oxide, and the length of the device's channel have become thinner or shorter than ever. The failure susceptibility of integrated circuits to ESD protection increases due to the IC fabrication towards sub-micron feature lengths.

Typically, input/output signals to a complimentary metal oxide semiconductor (CMOS) device are connected to input/output pads. The input/output pads are generally connected to the gates of metal oxide semiconductor (MOS) devices. All pins for input/output of MOS IC must be ESD protected to prevent harmful static discharge voltages from damaging the IC. In order to increase clock rate of digital systems, the number of the pins is increased in the IC. Subsequently, the available area for forming the guard ring is limited.

As shown in FIG. 1, it shows a conventional layout of ESD protection for a MOS service. The structure includes a plurality of finger structures 100 to serve as gate structures. The drain region 110, source regions 120 are formed between the gate structures 100. The gates 100, the sources 120 and drains 110 construct MOS devices. A ring area 130 having p+ doped ions surrounds the MOS devices and is connected to ground. Another ring area 140 keeps a distance from the ring area 130 and surrounds the ring area 130 for serving as a guard ring for the MOS device. Typically, the ring area 140 is doped with n+ doped ions. The current distribution of the gates is not uniform due to the MOS having LDD structure. The equivalent circuit of the prior art includes multi-bioplars. The current distribution in each bipolar is different due to each bipolar with different substrate-resistor. Thus, the ESD damage site is located at the region near P-substrate pick-up due to current crowing there.

Turning to FIG. 2, the structure includes a plurality of rectangular ring structures 200 to act as gates. Drains 210 are formed inside the rectangular ring structure 200. An area 220 outside the rectangular ring structure 200 is source. A ring structure 230 is adjacent to the area 220 and surrounds the area 220. The doped ions of the ring structure 230 is p+ impurities and connected to ground. An n+ doped region 240 is separated from the ring structure 230 with a distance to act a guard ring. The bias of the n+ doped region 240 is Vcc. Further, the ring structure 230 is surrounded by the n+ doped region 240.

A plurality of drain contacts 250 is located in the areas 210. A plurality of contacts 260 is formed in the ring structure 230 for electrical contact. The source 220 includes a plurality of source contacts 270 formed along the gate structures 200. In addition, the source contacts 270A between the neighboring gate structures 200 is shared by the two neighboring gate structures 200. FIG. 3 is a equivalent circuits drawing according to the FIG. 2, and the cross section view taken from the A–A' line of FIG. 2 is shown in FIG. 4. By analysis of the circuits, the layout of the aforementioned causes the current to accumulate at the p+ doped region 230, thus the current distribution is not uniform in the prior art. This will degrade the capability of ESD protection.

What is required is a layout structure to upgrade the carriers distribution uniform in the ESD protection circuits.

SUMMARY OF THE INVENTION

The structure includes a plurality of first ring shape structures formed on a semiconductor wafer to act as the gates of the MOS devices. The first ring shape structures are separated with a first space from each other. The areas in the inner side of the first ring shape structures are drain regions. A plurality of drain contacts are formed in the areas for electrical connections. A plurality of source regions having second ring shape structures are formed around each sides the first ring shape structures. A p conductive type region (for NMOS) is formed in the wafer adjacent to the source regions. The region surrounds all of the sides of the source regions. The p+ conductive type region is electrically connected to ground during operation.

A third ring shape structure having highly doped n conductive type ions is formed in the semiconductor wafer to surround the p+ conductive type region for serving as a guard ring. The bias of the ring shape structure is electrically connected to Vcc. The ring shape structure is separated from the p+ conductive type region with a space. Further, a plurality of contacts are formed in the p+ conductive type region adjacent to the source regions for electrical contact.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
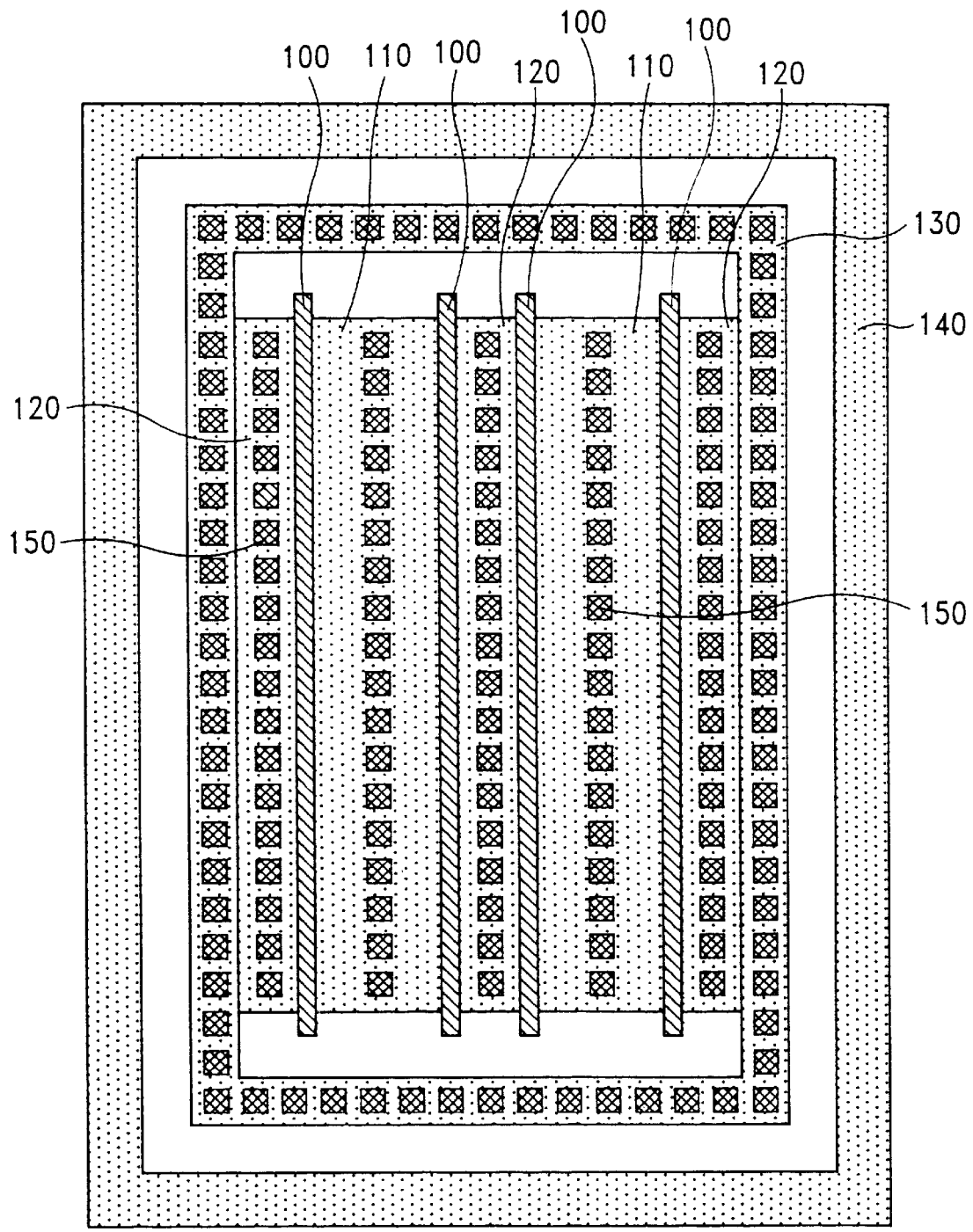
FIG. 1 is a layout structure of a first embodiment of prior art.
Figure 2:
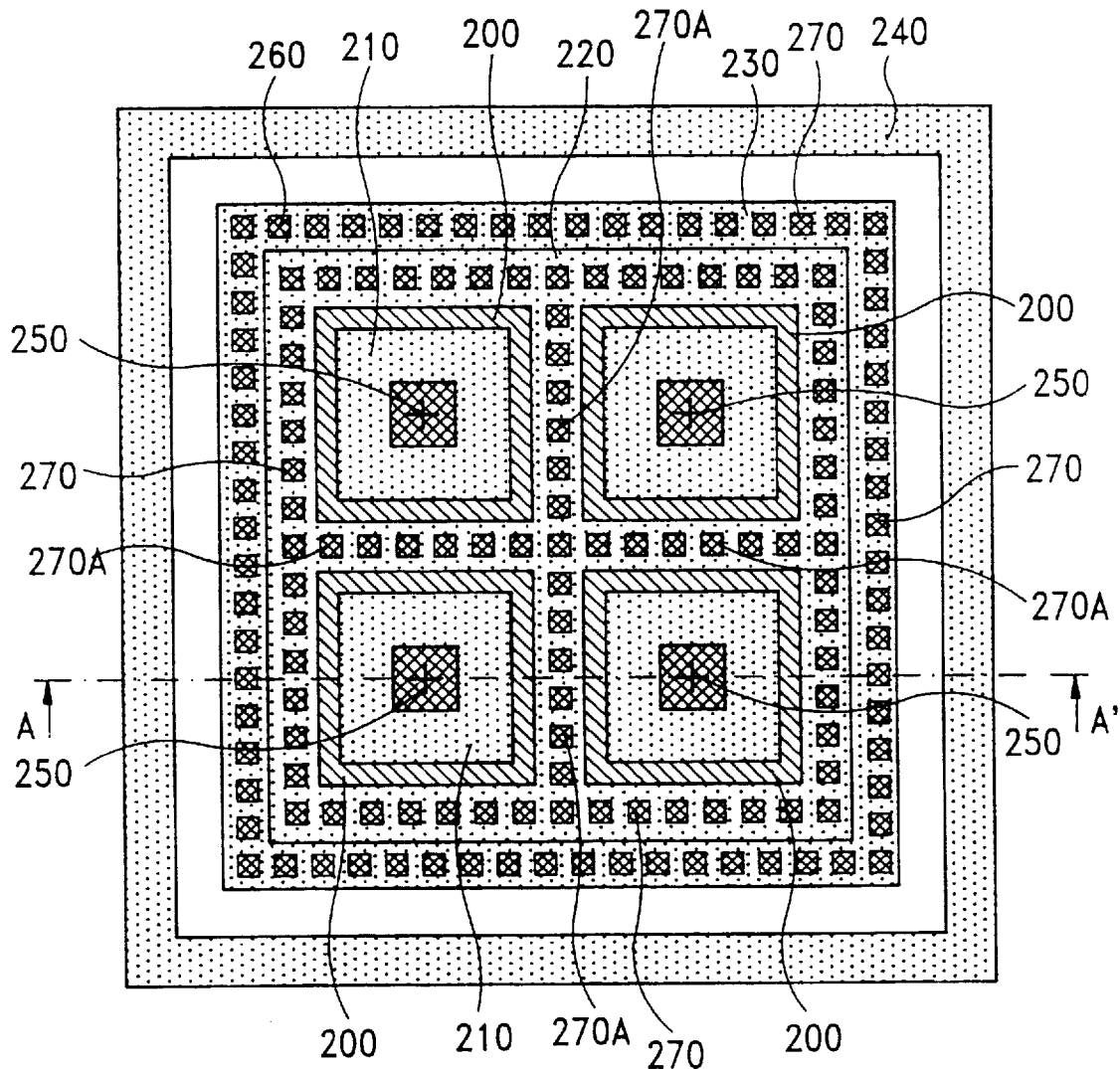
FIG. 2 is a layout structure of a second embodiment of prior art.
Figure 3:
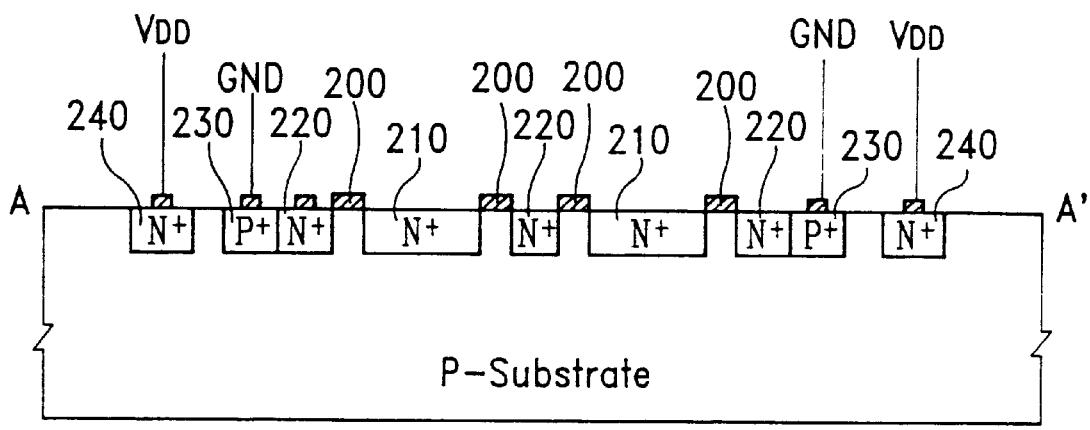
FIG. 3 is an effective circuit according to the second embodiment of prior art.
Figure 4:
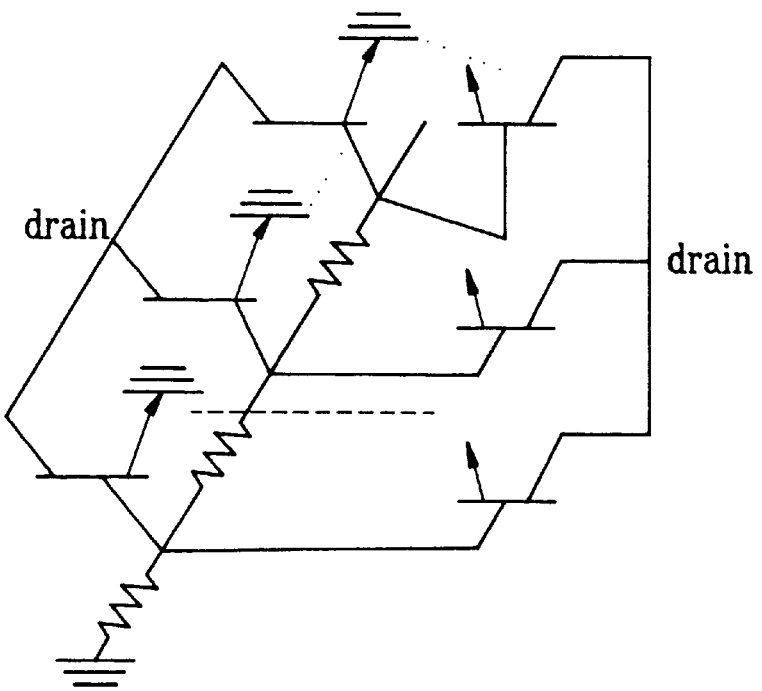
FIG. 4 is a cross section view cross section view taken from the A–A' line in accordance with the second embodiment of prior art.
Figure 5:
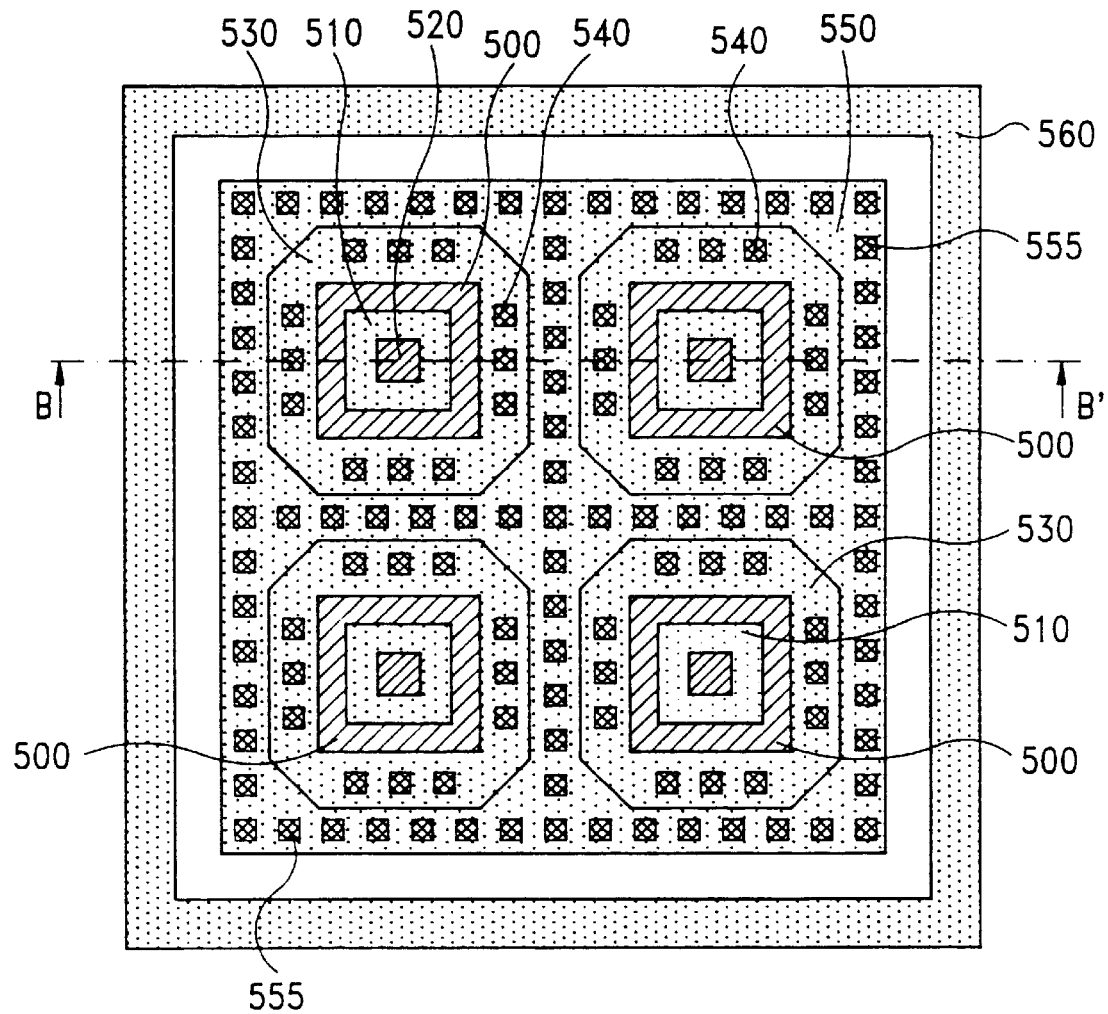
FIG. 5 is a layout structure in accordance with an embodiment of the present invention.

The present invention discloses a layout structure of ESD protection for MOS devices. P+ doped areas are implanted between neighboring MOS units thereby providing the bipolar having the same base resistance to eliminate the problem associated with the non-uniform current distribution. Referring to FIG. 5, the structure according to the present invention includes a plurality of ring shaped structures 500 formed on a semiconductor wafer to act as the gates of the MOS devices. Preferably, the shapes of gates 500 are square ring shapes 500. Of course, any suitable shape, such as rectangular, circle, can be used for the ring shape structure 500. The ring shape structures 500 are separated by a first space from each other. The areas 510 in the inner side of the ring shape structures 500 are drain regions. In NMOS, they are n conductive type regions. Conversely, the areas 510 are p conductive type regions for PMOS. A plurality of drain contacts 520 are formed in the areas 510 for electrical connection. Each ring shape structure 500 is defined as a gate unit.

A plurality of source regions 530 in the wafer having ring shape structures are formed around each side of the ring shape structures 500 and adjacent to them. Namely, each source region 530 surrounds a ring shape structure 500. The source regions 530 are separated from each other by a second space. The first space is wider than the second space such that the ring shape structures 500 are respectively isolated in the source regions 530. The shape of the plurality of source regions 530 can be any suitable shape, such as square, rectangular or polygon. The areas for forming the sources, drains can be interchanged.

Still turning to FIG. 5, a p conductive type region 550 (for NMOS) is formed in the wafer adjacent to the source region 530.

The region 550 surrounds the all of the sides of the source regions 530. The p conductive type region 550 is a highly doped region (p+). Particularly, a portion of the p conductive type region 550 is formed between the source regions 530. The p+ conductive type region 550 is electrically connected to ground during operation. Alternatively, if the devices are PMOS, then the region 550 is doped with n type conductive type ions. The type of the doped ions in the source regions 530 is dependent on the type of the device. In the present invention, each gate unit is separated from other gate units. The source contacts 540 are configured around the corresponding gate structure (unit) 500.

A ring shape structure 560 having highly doped n conductive type ions is formed in the semiconductor wafer to surround the p+conductive type region 550 for serving as a guard ring. The bias of the ring shape structure 560 is electrically connected to Vcc while operation. The ring shaped structure 560 is separated from the p+ conductive type region 550 with a third space. It means that the ring shape structure 560 does not contact with the p+ conductive type region 550. Further, any suitable shape can be used for the ring shape structure 560. For example, the shape of the ring shape structure 560 can be square, rectangular or the like. Similarly, the ring shape structure 560 is formed with highly n conductive type ions for the PMOS application. Further, a plurality of contacts 555 are formed in the p+ conductive type region 550 adjacent to the source regions 530 for electrical contact.

Figure 6:
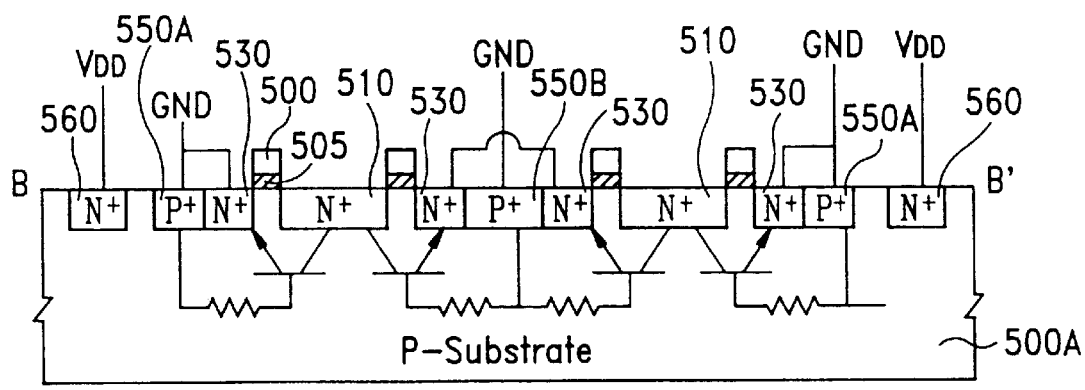
FIG. 6 is a cross section view taken from the B–B' line in accordance with the embodiment of the present invention.

FIG. 6 is a cross section view taken from the B–B' line in accordance with the embodiment of the present invention. In order to give a detailed description, the present invention uses NMOS as an example. It well known in the art, the present invention can also be used in PMOS. At least two pairs of gates 500 having gate oxides 505 are formed over the semiconductor wafer 500A. Each pair of the gates 500 is separated from other pairs a space. Drains 510 are formed in the semiconductor wafer 500A, in the areas between two gates 500 of a same pairs, and the drains 510 include n conductive type ions. Sources 530 are formed in the semiconductor wafer 500A and adjacent to the gates 500, and the sources 530 are separated from the drains 510. At least two of the sources 530 are formed in the space between the two pairs of gates 500. The sources 530 include n conductive type ions.

First p conductive type ion regions 550A are formed in the semiconductor wafer 500A, and are adjacent to the sources 530 that are not in the space between the two pairs of gates 500. A second p conductive type ion region formed in the semiconductor wafer 500A. The second p conductive type ion region 550B is located between and adjacent to the sources 530 that is in the space between the two pairs of gates 500. A pair of n conductive type guard rings 560 are respectively separated from the p conductive type regions 550A, by a space.

As is understood by a person skilled in the art, the foregoing preferred embodiments of the present invention are illustrative of the present invention rather than a limitation of the present invention. For example, the shape of gate structure can be square, rectangular or the like. Further, the present invention can not only be used in NMOS, PMOS but also in CNOS, BiMOS. It is intended to cover various modifications and similar arrangements included within the spirit and scope of the appended claims, the scope of which should be accorded-the broadest interpretation so as to encompass all such modifications and similar structure. Thus, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. An electro-static discharge (ESD) protection structure for semiconductor devices, said structure comprising:

a plurality of first ring-shaped gate structures formed on a semiconductor wafer;

a plurality of first doped regions formed in said wafer in inner areas of said first ring shape structures to act as drains, said plurality of first doped regions including n conductive type ions;

a plurality of second doped regions formed in said wafer, said plurality of second doped regions being second ring shape structures;

wherein each of said plurality of second doped regions surrounds only one of said plurality of gate structures; and wherein said plurality of second doped regions includes n conductive type ions to serve as sources;

a p conductive type ions region formed around said plurality of second doped regions and between thereof, thereby separating said plurality of second doped regions; and a third ring shape structure having n conductive type ions surrounding said p conductive type ions region and being separated from said p conductive type ions region with a space to act as a guard ring.

2. The structure of claim 1, wherein said plurality of first doped regions are drains of said semiconductor devices.

3. The structure of claim 2, wherein said plurality of second doped regions are sources of said semiconductor devices.

4. The structure of claim 1, wherein said second conductive type ions region is electrically connected to ground during operation.

5. The structure of claim 1, wherein said third ring shape structure is electrically connected to Vcc during operation.

6. The structure of claim 1, wherein said plurality of first ring shape structures are selected from a group consisting of square ring shapes and rectangular ring shapes.

7. The structure of claim 1, wherein said plurality of second ring shape structures are selected from a group consisting of square ring shapes and rectangular ring shapes.

8. The structure of claim 1, wherein said third ring shape structure is selected from the group consisting of a square ring shape and a rectangular ring shape.

9. A structure of NMOS devices formed in a semiconductor wafer, said structure comprising:

at least two pairs of gates formed over said semiconductor wafer, each pair of said gates being spaced from each other;

drains, including n-conductive ions, formed in said semiconductor wafer in areas between two said gates of a same pair;

sources, including n-conductive ions, formed in said semiconductor wafer adjacent to said gates separated from said drains, at least two of said sources formed in said space;

first p conductive type ion regions formed in said semiconductor wafer being adjacent to said sources that are not in said space;

a second p conductive type ion region formed in said semiconductor wafer being between and adjacent to said sources that are in said space, wherein said first p conductive type ion regions and said second p conductive type ion regions formed between said at least two pair of gates provide for a uniform current distribution; and first conductive ion regions formed in a peripheral area of said first p conductive type ions regions and kept a distance from said first p conductive type ions regions to act as a guard ring.

* * * * *